United States Patent
Chen et al.

(10) Patent No.: US 9,680,123 B2
(45) Date of Patent: Jun. 13, 2017

(54) LIGHT EMITTING DEVICE, ELECTRODE STRUCTURE AND MANUFACTURING METHOD THEREOF

(71) Applicant: Industrial Technology Research Institute, Hsinchu (TW)

(72) Inventors: Chang-Ying Chen, Kaohsiung (TW); Hsi-Hsuan Yen, Taipei (TW); Chun-Ting Liu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/953,430

(22) Filed: Nov. 30, 2015

(65) Prior Publication Data
US 2016/0172618 A1 Jun. 16, 2016

Related U.S. Application Data

(60) Provisional application No. 62/090,359, filed on Dec. 11, 2014.

(30) Foreign Application Priority Data

Jun. 29, 2015 (TW) .............................. 104120972 A

(51) Int. Cl.
*H01L 51/52* (2006.01)
*H01L 51/56* (2006.01)
*H01L 51/00* (2006.01)

(52) U.S. Cl.
CPC ...... *H01L 51/5212* (2013.01); *H01L 51/5215* (2013.01); *H01L 51/0023* (2013.01); *H01L 51/56* (2013.01); *H01L 2251/5361* (2013.01)

(58) Field of Classification Search
CPC ............. H01L 51/5203; H01L 51/0023; H01L 51/5012; H01L 51/56
See application file for complete search history.

(56) References Cited

U.S. PATENT DOCUMENTS 6,812,637 B2 11/2004 Cok et al.
7,495,389 B2 2/2009 Noguchi et al.
(Continued)

FOREIGN PATENT DOCUMENTS

CN 102171851 8/2011
CN 102593194 7/2012
(Continued)

OTHER PUBLICATIONS

Park et al., "Luminance Uniformity of Large-Area OLEDs With an Auxiliary Metal Electrode ," Journal of Display Technology, Aug. 2009, pp. 306-311.
(Continued)

*Primary Examiner* — Karen Kusumakar
(74) *Attorney, Agent, or Firm* — Jianq Chyun IP Office

(57) ABSTRACT

A light emitting device including a substrate, a first electrode structure, an organic light emitting structure and a second electrode structure is provided. The first electrode structure includes a first transparent conductive layer, a patterned conductive layer and a second transparent conductive layer disposed on the substrate in sequence, so that the patterned conductive layer is interposed between the second transparent conductive layer and the first transparent conductive layer in a thickness direction of the substrate. The organic light emitting structure and the second electrode structure are disposed on the substrate, and the organic light emitting structure is located between the first electrode structure and the second electrode structure in the thickness direction of the substrate. An electrode structure and a manufacturing method thereof are also provided.

21 Claims, 15 Drawing Sheets

(56) References Cited

U.S. PATENT DOCUMENTS

| | | |
|---|---|---|
| 7,839,083 B2 | 11/2010 | Kubota |
| 7,990,050 B2 | 8/2011 | Eom |
| 8,120,248 B2 | 2/2012 | Shinto et al. |
| 8,203,263 B2 | 6/2012 | Langguth et al. |
| 8,354,980 B2 | 1/2013 | Kwak |
| 8,759,821 B2 | 6/2014 | Kobayashi et al. |
| 2006/0162770 A1* | 7/2006 | Matsui ............... H01G 9/2031 136/263 |
| 2009/0085475 A1* | 4/2009 | Park ................... H01L 51/5004 313/504 |
| 2009/0294157 A1* | 12/2009 | Lee ..................... H01L 51/5203 174/256 |
| 2010/0051973 A1 | 3/2010 | Kobayashi et al. |
| 2011/0012935 A1 | 1/2011 | Seo et al. |
| 2012/0018749 A1 | 1/2012 | Lee et al. |
| 2012/0146030 A1 | 6/2012 | You et al. |
| 2012/0190144 A1 | 7/2012 | Kang et al. |
| 2012/0252303 A1 | 10/2012 | Otsuka et al. |
| 2013/0285041 A1* | 10/2013 | Suematsu .......... H01L 51/5215 257/40 |
| 2014/0034920 A1 | 2/2014 | Lee et al. |
| 2014/0097424 A1 | 4/2014 | Miyai et al. |
| 2014/0306210 A1 | 10/2014 | Lee et al. |
| 2014/0339513 A1* | 11/2014 | Yim ................... H01L 51/5203 257/40 |

FOREIGN PATENT DOCUMENTS

| | | |
|---|---|---|
| JP | 2009076668 | 4/2009 |
| TW | 200729241 | 8/2007 |
| TW | 200729572 | 8/2007 |
| TW | 201110153 | 3/2011 |
| TW | I391026 | 3/2013 |
| TW | 201324888 | 6/2013 |
| TW | I402583 | 7/2013 |
| TW | 201333773 | 8/2013 |
| TW | 201413753 | 4/2014 |
| TW | 201440080 | 10/2014 |

OTHER PUBLICATIONS

Oostra et al., "Prevention of short circuits in solution-processed OLED devices," Organic Electronics, Jun. 2014, pp. 1166-1172.

Joerg Amelung, "Large-area organic light-emitting diode technology," SPIE, Apr. 2008, pp. 1-2.

Choi et al., "ITO-free large-area organic light-emitting diodes with an integrated metal grid," Optics Express, Jul. 4, 2011, pp. A793-A803.

Barink et al., "Analytical model for current distribution in large-area organic light emitting diodes with parallel metal grid lines," Journal of Applied Physics, Sep. 2012, pp. 054507-1-054507-7.

Park et al., "Large-Area OLED Lightings and Their Applications,"Semiconductor Science and Technology, Feb. 14, 2011, pp. 1.

Park et al., "Optical and thermal properties of large-area OLED lightings with metallic grids," Organic Electronics, Jan. 2012, pp. 184-194.

Schwamb et al., "Passive cooling of large-area organic light-emitting diodes," Organic Electronics, Aug. 2013, pp. 1939-1945.

Slawinski et al., "Investigation of large-area OLED devices with various grid geometries," Organic Electronics, Oct. 2013, pp. 2387-2391.

"Office Action of Taiwan Counterpart Application," issued on Feb. 17, 2016, p. 1-p. 3, in which the listed references were cited.

* cited by examiner

LIGHT EMITTING DEVICE, ELECTRODE STRUCTURE AND MANUFACTURING METHOD THEREOF

CROSS-REFERENCE TO RELATED APPLICATION

This application claims the priority benefits of U.S. provisional application Ser. No. 62/090,359, filed on Dec. 11, 2014 and Taiwan application serial no. 104120972, filed on Jun. 29, 2015. The entirety of each of the above-mentioned patent applications is hereby incorporated by reference herein.

TECHNICAL FIELD

The technical field relates to a light emitting device, an electrode structure and a manufacturing method thereof.

BACKGROUND

The organic light-emitting diode (OLED) elements have the characteristics of having a thin thickness; having a good shock resistance as being solid-state components and easily being adapted to harsh environments; and being mostly self-luminous and without substantial problems of the viewing angle. Therefore, the lighting device applying the OLED element may have advantages. For example, the light source of an OLED device is a diffusion based surface light source, therefore, the light emitted from the OLED device is relatively soft, and has a light and thin appearance. Also, the shape for an OLED device using a flexible substrate may be changed into any of different shapes. Furthermore, for an OLED device using a transparent electrode, the transmittance of the OLED device is like that of a glass when the OLED elements in the OLED device does not emit light. Therefore, the applications of OLED devices may be wider than those of other lighting technologies or devices thereof.

Furthermore, an OLED element is a current-driven element, and a light emitting layer in the OLED element is typically driven by two electrodes as an anode and a cathode, respectively. The anode and the cathode may be, but not limited to two transparent electrodes. Take a transparent electrode as an example, as the area of an OLED device is increased, the impedance of the transparent electrode will also increase with a longer distance. This would cause the emitting light of the OLED device is not uniform, and further produce the heat locally and affect the service life of the OLED device. Accordingly, in order to improve the impedance of the transparent electrode, an auxiliary electrode could be disposed on one of transparent electrodes (for example, the lower one of the transparent electrodes), such that the optical efficiency (for example, light uniformity) of the OLED element could be enhanced.

In general, the auxiliary electrode is formed on a metal wire or a metal mesh on the lower transparent electrode by a printing process, so that the auxiliary electrode could have a rough surface. Once a light emitting layer is formed on the lower transparent electrode and the auxiliary electrode, the light emitted from the light emitting layer disposed on the auxiliary electrode would not be uniformly distributed or it would crack the light emitting layer. So that, the auxiliary electrode would contacts the upper transparent electrode via the crack place of the light emitting layer and a short circuit of the light emitting device would occurs. Nowadays, configuring an insulator layer on the auxiliary electrode is also provided to avoid the aforementioned contact of the auxiliary electrode and the upper transparent electrode.

SUMMARY

According to an embodiment of the disclosure, a light emitting device comprises a substrate, a first electrode layer, an organic light emitting layer and a second electrode layer. The first electrode layer is disposed on the substrate, the organic light emitting layer is disposed on the substrate and the second electrode layer is disposed on the substrate, wherein the organic light emitting layer is disposed between the first electrode layer and the second electrode layer in a thickness direction of the substrate. The first electrode layer further includes a first transparent conductive layer, a patterned conductive layer and a second transparent conductive layer. The first transparent conductive layer is disposed on the substrate, the patterned conductive layer is disposed on the first transparent conductive layer, and the second transparent conductive layer is disposed on the patterned conductive layer and the first transparent conductive layer. The patterned conductive layer is interposed between the second transparent conductive layer and the first transparent conductive layer in the thickness direction of the substrate.

According to another embodiment of the disclosure, an electrode structure comprises a first transparent conductive layer, a patterned conductive layer and a second transparent conductive layer. The first transparent conductive layer is disposed on the substrate, the patterned conductive layer is disposed on the first transparent conductive layer, and the second transparent conductive layer is disposed on the patterned conductive layer and the first transparent conductive layer. The patterned conductive layer is interposed between the second transparent conductive layer and the first transparent conductive layer in a thickness direction of the substrate.

According to another embodiment of the disclosure, a manufacturing method of an electrode structure comprises: forming a first transparent conductive layer on a substrate; forming a patterned conductive layer on the first transparent conductive layer, wherein the patterned conductive layer is formed by applying a printing process; and forming a second transparent conductive layer on the patterned conductive layer and the first transparent conductive layer, wherein the patterned conductive layer is interposed between the second transparent conductive layer and the first transparent conductive layer in a thickness direction of the substrate.

The foregoing will become better understood from a careful reading of a detailed description provided herein below with appropriate reference to the accompanying drawings.

DETAILED DESCRIPTION OF DISCLOSED EMBODIMENTS

Figure 1:
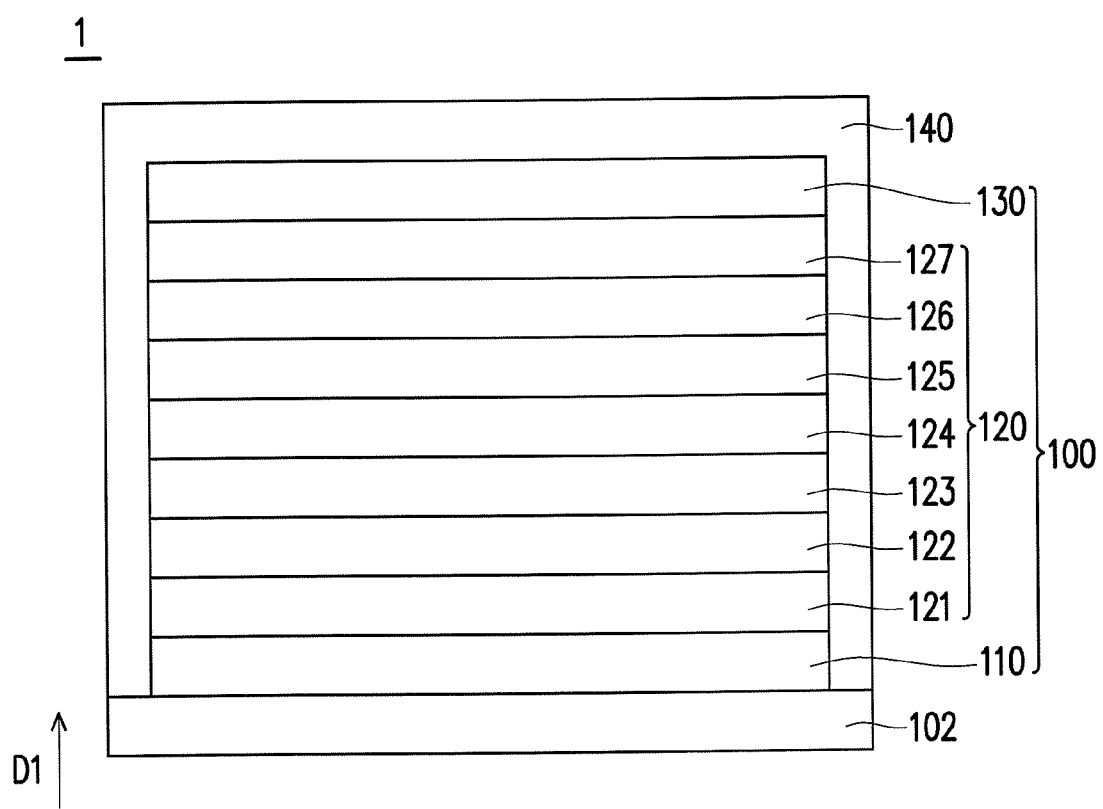
FIG. 1 illustrates a light emitting device according to one embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 schematically illustrates a light emitting device according to one embodiment of the disclosure. Referring to FIG. 1, a light emitting device 1 includes a substrate 102, a first electrode layer 110, an organic light emitting layer 120 and a second electrode layer 130. The first electrode layer 110 is disposed on the substrate 102. The organic light emitting layer 120 is disposed on the substrate 102. The second electrode layer 130 is disposed on the substrate 102. The organic light emitting layer 120 is disposed between the first electrode layer 110 and the second electrode layer 130 in a thickness direction D1 of the substrate 102 (a direction along the thickness of the substrate 102). In other words, the organic light emitting layer 120 is placed in-between the first electrode layer 110 and the second electrode layer 130. As shown in FIG. 1, the first electrode layer 110 and the second electrode layer 130 are single layer structures, but the first electrode layer 110 or the second electrode layer 130 may be, but not limited to composite layer electrode structure (as the first electrode layer 110 in FIG. 3). The first electrode layer 110 and the second electrode layer 130 are used as anode and cathode to drive the organic light emitting layer 120 for emitting light, respectively. The first electrode layer 110, the organic light emitting layer 120 and the second electrode layer 130 together form a light emitting unit 100 on the substrate 102.

In the present embodiment, the substrate 102 may be, but not limited to a flexible substrate, wherein the material of the flexible substrate may be polyimide (PI), polyethylene terephthalate (PET), polyethylene naphthalate (PEN), or the like. In another embodiment, the substrate 102 may be made of glass or other rigid material. Alternately, the substrate 102 may also be a composite substrate made of a plurality of material layers for providing gas/vapor barrier functions, wherein the material layers may include at least one organic layer and/or at least one inorganic layer. The disclosure is not limited thereto.

Figure 2:
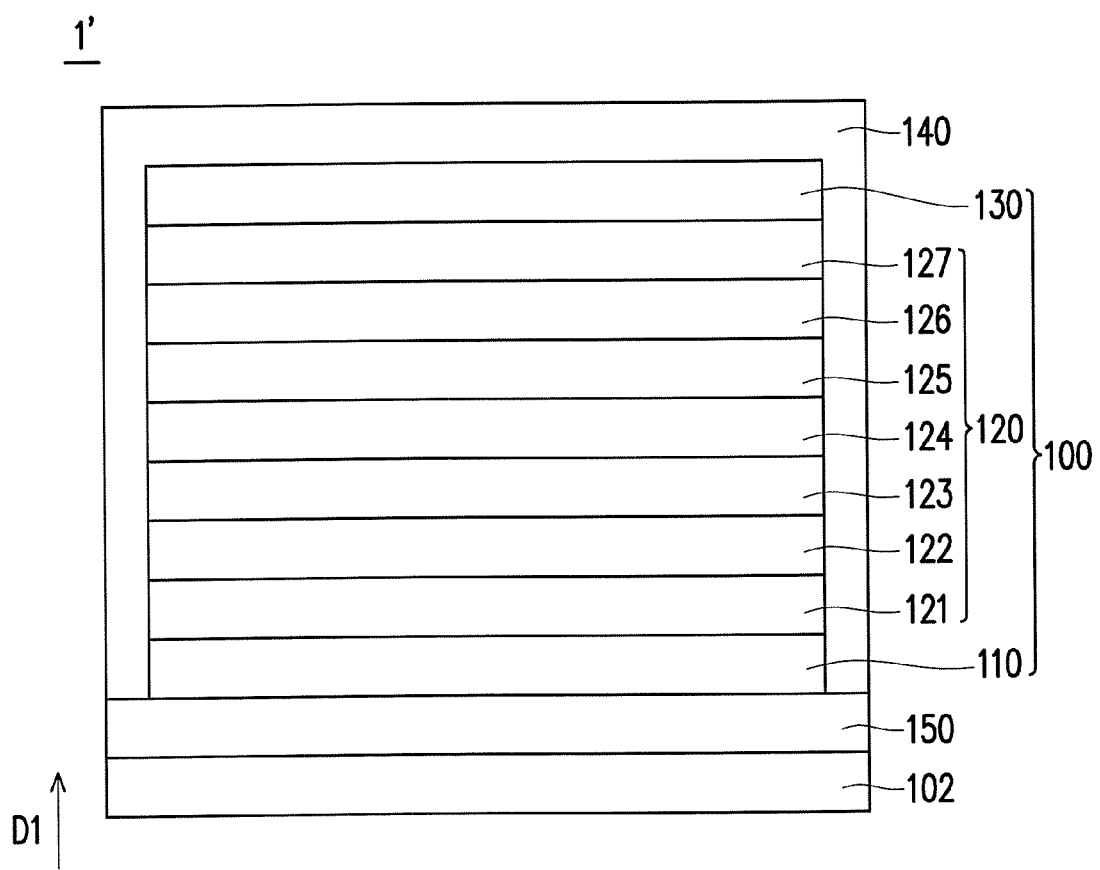
FIG. 2 illustrates a light emitting device according to another embodiment of the disclosure.

In the present embodiment, the light emitting device 1 further includes an encapsulation layer 140 disposed on the substrate 102. The encapsulation layer 140 may provide gas/vapor barrier functions. The substrate 102 and the encapsulation layer 140 together encapsulate the stack of the first electrode layer 110, the organic light emitting layer 120 and the second electrode layer 130. FIG. 2 illustrates a light emitting device according to another embodiment of the disclosure. Please refer to FIG. 2, the light emitting device 1' in FIG. 2 is similar to the light emitting device 1 in FIG. 1, and unlike in FIG. 1, the light emitting device 1' in FIG. 2 further includes a barrier layer 150. The barrier layer 150 is disposed between the substrate 102 and the first electrode layer 110. The barrier layer 150 and the encapsulation layer 140 together encapsulate the stack of the first electrode layer 110, the organic light emitting layer 120 and the second electrode layer 130. The barrier layer 150 may include at least one organic layer and/or at least one inorganic layer. From the aforementioned, it may be seen that the structure of the barrier layer 150 or the encapsulation layer 140 may be optional, but not limited to the aforementioned exemplars. Also, the disposition of the barrier layer 150 or the encapsulation layer 140 is optional.

Please refer to FIG. 1 again, in the embodiment of FIG. 1, the organic light emitting layer 120 is formed by sequentially stacking a first carrier injection layer 121, a first carrier transmission layer 122, an second carrier blocking layer 123, an emission layer 124, a first carrier blocking layer 125, a second carrier transmission layer 126 and an second carrier injection layer 127, from the first electrode layer 110 to the second electrode layer 130. The first carrier and the second carrier described in the embodiment may be considered as two different types of carriers such as electron and hole. For example, the first carrier is an electron and the second carrier is a hole, or the first carrier is the hole and the second carrier is the electron. The disclosure is not limited thereto. In another embodiment, the organic light emitting layer 120 may selectively include only the emission layer 124, in which the first carrier injection layer 121, the first carrier transmission layer 122, the second carrier blocking layer 123, the first carrier blocking layer 125, the second carrier transmission layer 126 and the second carrier injection layer 127 may be omitted in the embodiment.

Figure 3:
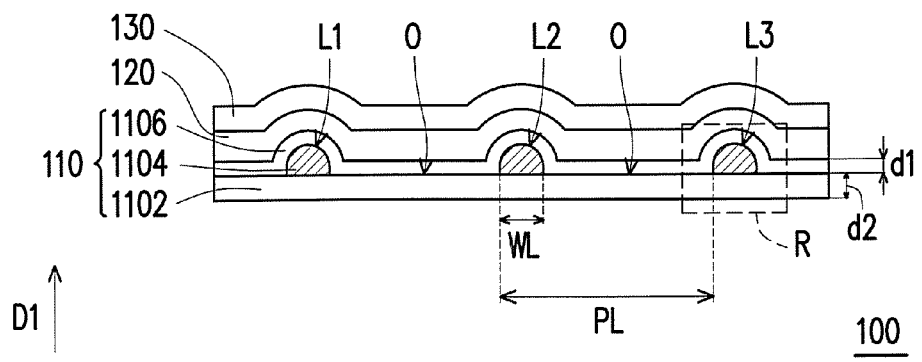
FIG. 3 illustrates a light emitting unit of FIG. 1.

FIG. 3 schematically illustrates a light emitting unit 100 of FIG. 1. In FIG. 3, the organic light emitting layer 120 and the second electrode layer 130 are illustrated as two single layer structures, but they may be composite layer structure (as the organic light emitting layer 120 in FIG. 1). Please refer to FIG. 1 and FIG. 3, in the embodiment of FIG. 3, the first electrode layer 110 may be, but not limited to a composite electrode layer disposed on the substrate 102 (as shown in FIG. 1). The first electrode layer 110 includes a first transparent conductive layer 1102, a patterned conductive layer 1104 and a second transparent conductive layer 1106, wherein the first transparent conductive layer 1102 is disposed on the substrate 102, the patterned conductive layer 1104 is disposed on the first transparent conductive layer 1102 and the second transparent conductive layer 1106 is disposed on the patterned conductive layer 1104 and the first transparent conductive layer 1102. The patterned conductive layer 1104 is disposed between the first transparent conductive layer 1102 and the second transparent conductive layer 1106 in the thickness direction D1 of the substrate 102. In other words, the patterned conductive layer 1104 is placed between the first transparent conductive layer 1102 and the second transparent conductive layer 1106. The patterned conductive layer 1104 is covered by the second transparent conductive layer 1106 such that the patterned conductive layer 1104 does not contact the organic light emitting layer 120 which is disposed between the first electrode layer 110 and the second electrode layer 120.

In the embodiment, the first transparent conductive layer 1102 may be made of transparent conductive material such as metal oxide, conductive polymer, or the like. Alternately, the first transparent conductive layer 1102 may be made of fine-sized material such as carbon nanotube (CNT), nano metal wire, grapheme, or the like. The transparent conductive metal oxide may be, but not limited to an indium tin oxide (ITO), an indium zinc oxide (IZO), or a zinc oxide (ZnO). The conductive polymer may be, but not limited to polythiophene, poly-3,4-ethylenedioxythiophene (PEDOT). The nano metal wire in the embodiment may be, but not limited to silver (Ag) wire, gold (Au) wire, platinum (Pt) wire or metal mesh with nano line width. The first transparent conductive layer 1102 may be made of any combination of the above materials, the disclosure is not limited thereto. For example, in one embodiment, the first transparent conductive layer 1102 may be made of indium tin oxide (ITO) to form a transparent conductive layer to cover the substrate 102, therefore the surface roughness of the first transparent conductive layer 1102 may be decreased. This may facilitate the formation of the patterned conductive layer 1104.

In the embodiment of FIG. 3, the patterned conductive layer 1104 may be made of a conductive material. The conductivity of the patterned conductive layer 1104 may be better than that of the first transparent conductive layer 1102. Therefore, the patterned conductive layer 1104 may be made of metal material such as copper, silver, platinum, molybdenum, etc., but the disclosure is not limited thereto. As aforementioned, the patterned conductive layer 1104 has a good conductivity, therefore, the conductivity of the first transparent conductive layer 1102 may be improved. Furthermore, the impedance of the first electrode layer 110 may be decreased. Therefore, the patterned conductive layer 1104 may considered as an auxiliary electrode.

As shown in the embodiment of FIG. 3, the patterned conductive layer 1104 further includes a plurality of linear patterns. Assume that the patterned conductive layer 1104 includes linear patterns L1, L2 and L3. The linear patterns L1, L2 and L3 are disposed on the first transparent conductive layer 1102, which may define at least one opening O. Wherein, the ratio of the line width WL to the line pitch (or refer as arrangement cycle) PL of linear patterns L1, L2 and L3 may can be greater than 1/500, or even greater than 1/300, wherein the line width WL may be smaller than 200 μm, or even smaller than 30 μm. Therefore, the patterned conductive layer 1104 may be formed as a grid conductive layer or a mesh conductive layer on the first transparent conductive layer 1102 (As shown in FIG. 8A to FIG. 8E). The linear patterns L1, L2 and L3 constructing the patterned conductive layer 1104 are distributed on the first transparent conductive layer 1102 uniformly, thus, the first transparent conductive layer 1102 may have an effect of uniform electric transmission, which helps to enhance the light emitting uniformity of the light emitting device 1/1' or the light emitting unit 100. The distribution and the arrangement of the linear patterns L1, L2 and L3 may be adjusted according to the demands, but not limited to the embodiments in the disclosure.

In the embodiment, the patterned conductive layer 1104 is made of non-transparent metal material, but it may be constructed by distributing a plurality of linear patterns L1, L2, L3 on the first transparent conductive layer 1102, and at least one opening O may be defined via the plurality of linear patterns L2, L2 and L3, therefore, the patterned conductive layer 1104 is transparent to the naked eyes, and the light emitted from organic light emitting layer 120 is allowed to pass through the patterned conductive layer 1104. Although the disposition of the patterned conductive layer 1104 may improve the conductivity of the first electrode layer 110 and enhance the light emitting uniformity of the light emitting device 1/1' or the light emitting unit 100, and the at least one opening O may allow the light to pass through the patterned conductive layer 1104, the patterned conductive layer 1104 may still affect the uniformity of the light emission efficiency. For example, the light emission efficiency of the light emitting device 1/1' or the light emitting unit 100 corresponding to the linear patterns L1, L2, L3 is lower than that of the light emitting device 1/1' or the light emitting unit 100 corresponding to the at least one openings O. In addition, the patterned conductive layer 1104 may be printed on the first transparent conductive layer 1102 by applying a printing process, therefore the patterned conductive layer 1104 may have a rougher surface. If the organic light emitting layer 120 is formed on the patterned conductive layer 1104 and the first transparent conductive layer 1102, the light emitted from the organic light emitting layer 120 will not be uniformly distributed at the place corresponding to the patterned conductive layer 1104 or it even cracks the patterned conductive layer 1104 because of the high surface roughness of the patterned conductive layer 1104. This may cause the first electrode layer 110 to contacts the second electrode layer 120 via the crack place of the patterned conductive layer 1104 and result in a short circuit of the light emitting device 1/1' or the light emitting unit 100. Therefore, in an embodiment, the second transparent conductive layer 1106 is used to avoid the aforementioned issue caused by the high surface roughness of the patterned conductive layer 1104.

In the embodiment, the second transparent conductive layer 1106 may be made of the material capable of making the first transparent conductive layer 1102 set forth in above. In addition, the first transparent conductive layer 1102 and the second transparent conductive layer 1106 may be made of the same material or different materials. The disclosure is not limited thereto. In an embodiment, the second transparent conductive layer 1106 may be made of indium tin oxide (ITO) to form a transparent conductive layer to cover the patterned conductive layer 1104. The surface roughness of the second transparent conductive layer 1106 is lower than that of the patterned conductive layer 1104. The thickness d1 of the second transparent conductive layer 1106 in a thickness direction D1 of the substrate 102 may be less than or equal to the thickness d2 of the first transparent conductive layer 1102 in a thickness direction D1 of the substrate 102. In addition, the light transmission rate of the first transparent conductive layer 1102 or the second transparent conductive layer 1106 may be, but not limited to greater than 70% or even greater than 80%. The impedance of the first transparent conductive layer 1102 or the second transparent conductive layer 1106 may can be, but not limited to less than 100 ohm/sq, less than 50 ohm/sq or less than 15 ohm/sq. After the disposition of the second transparent conductive layer 1106 on the first transparent conductive layer 1102, the total light transmission rate of the first transparent conductive layer 1102 and the second transparent conductive layer 1106 is smaller than each of the light transmission rates of the first transparent conductive layer 1102 and the second transparent conductive layer 1106. The total impedance of the first transparent conductive layer 1102 and the second transparent conductive layer 1106 is also smaller than the each of the impedances of the first transparent conductive layer 1102 and the second transparent conductive layer 1106.

In an embodiment, the patterned conductive layer 1104 is placed between the first transparent conductive layer 1102 and the second transparent conductive layer 1106 in the thickness direction D1 of the substrate 102 and the patterned conductive layer 1104 is entirely covered by the second transparent conductive layer 1106, so that the patterned conductive layer 1104 fails to contact the organic light emitting layer 120. The second transparent conductive layer 1106 contacts the first transparent conductive layer 1102. For example, the second transparent conductive layer 1106 contacts the first transparent conductive layer 1102 via the one or more openings O of the patterned conductive layer 1104 such that the patterned conductive layer 1104 is encapsulated by the first transparent conductive layer 1102 and the second transparent conductive layer 1106. The line width WL of the second transparent conductive layer 1106 may be greater than that of the patterned conductive layer 1104, such that the area covered by the second transparent conductive layer 1106 is greater than the area covered by the patterned conductive layer 1104. For example, in the embodiment, the area covered by the second transparent conductive layer 1106 is greater than the area covered by the patterned conductive layer 1104 and roughly equal to the area covered by the first transparent conductive layer 1102, so that the second transparent conductive layer 1106 may cover the patterned conductive layer 1104. Also, the first transparent conductive layer 1102 and the second transparent conductive layer 1106 may be formed as a blanket, such that the patterned conductive layer 1104 is encapsulated by the first and the second transparent conductive layers.

Figure 4:
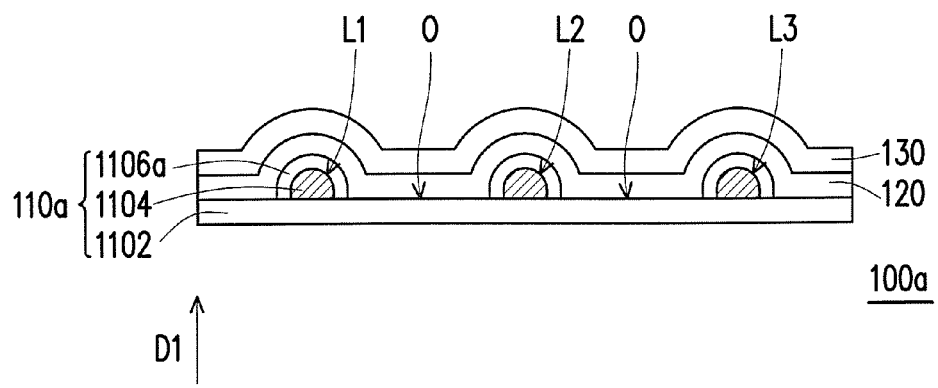
FIG. 4 illustrates a light emitting unit according to another embodiment of the disclosure.

FIG. 4 illustrates a light emitting unit 100a according to another embodiment of the disclosure. As shown in FIG. 4, the second conductive layer 1106a of the first electrode layer 110a of the light emitting unit 100a is different from the second conductive layer 1106 of the light emitting unit 100 shown in FIG. 3. The second conductive layer 1106 shown in FIG. 3 has a continuous layer structure, while the second conductive layer 1106a shown in FIG. 4 has a discontinuous layer structure consisting of a plurality of separated linear patterns. Therefore, the area covered by the second transparent conductive layer 1106a is smaller than the area covered by the first transparent conductive layer 1102, and the area covered by the second transparent conductive layer 1106a is greater than the area covered by the patterned conductive layer 1104. Also, the second transparent conductive layer 1106a may entirely cover all of the linear patterns L1, L2, L3 of the patterned conductive layer 1104. The first transparent conductive layer 1102 and the second transparent conductive layer 1106a may contact each other and the first transparent conductive layer 1102 and the second transparent conductive layer 1106a may be formed as a blanket to encapsulate the patterned conductive layer 1104.

Figure 5A:
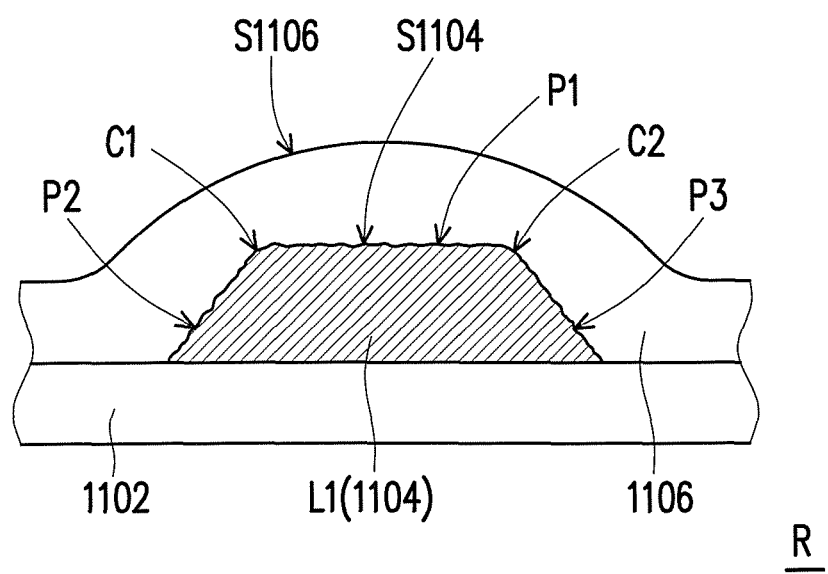
FIG. 5A illustrates an enlarged view of the first electrode layer of a portion R in FIG. 3.
Figure 5B:
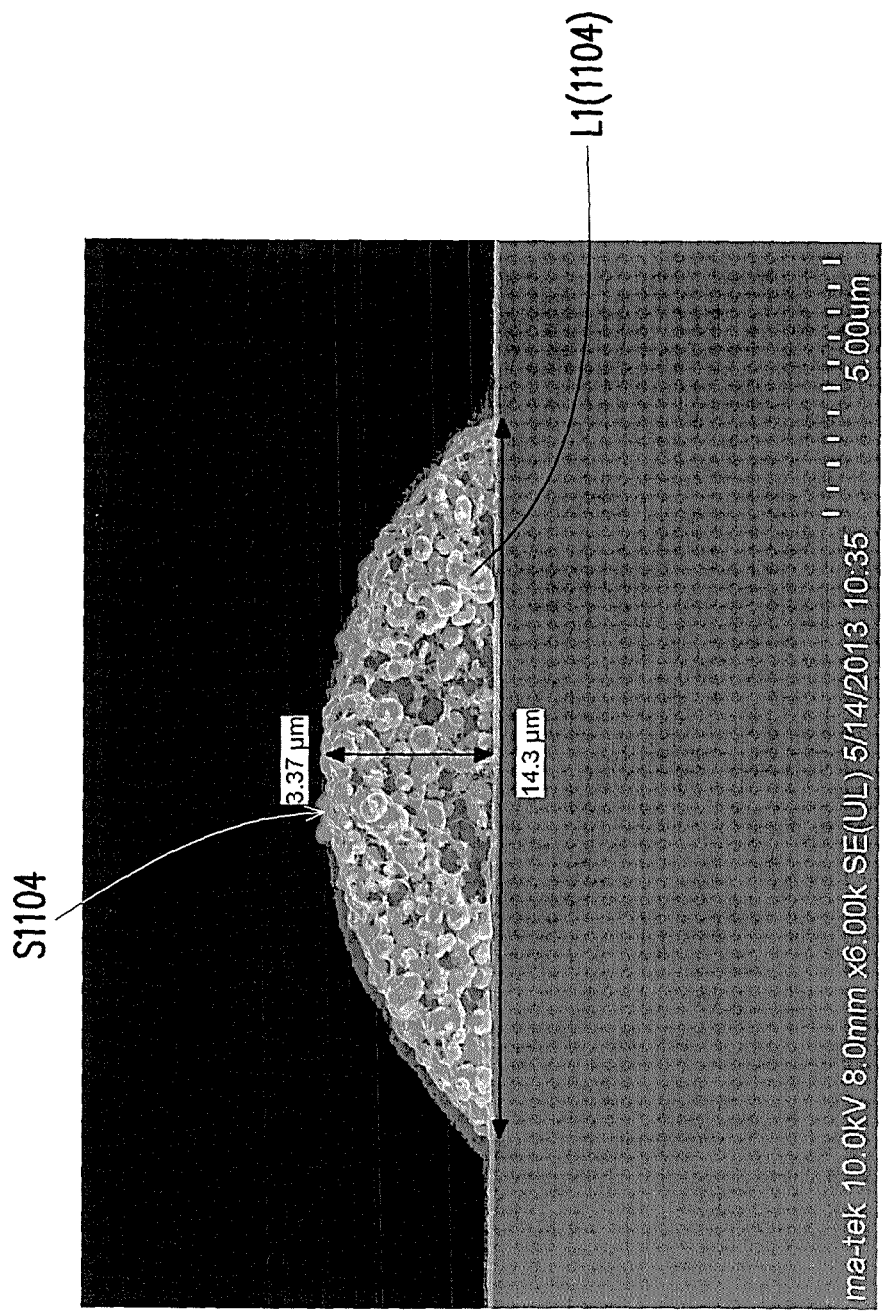
FIG. 5B is a microscopic picture of a cross section of the patterned conductive layer of FIG. 5A.

FIG. 5A illustrates an enlarged view of the first electrode layer of the portion R in FIG. 3. FIG. 5B is a microscopic picture of a cross section of the patterned conductive layer of FIG. 5A. Please refer to FIG. 3, FIG. 5A and FIG. 5B, the patterned conductive layer 1104 made by applying a printing process may have a rough surface because the particles (shown in FIG. 5B) in the conductive material printed on the first transparent conductive layer 1102 may have various sizes during the printing process. In other words, the printed patterned conductive layer 1104 is formed by a plurality of particular grains stacking together, so the printed patterned conductive layer 1104 has a non-smooth surface. In general, the outer appearance of the printed patterned conductive layer 1104 such as the height, the thickness distribution, the surface roughness and the like, is related to the printing speed, the viscosity of the printing material (e.g. ink), the curing temperature and/or other fabrication conditions. Furthermore, in the printing process, under the conditions of the same printing parameters, such as a printing speed, the same ink material and curing parameter (e.g., a curing temperature) and so on, the line width of the printed patterned conductive layer 1104 and the line thickness of the printed patterned conductive layer 1104 are positively correlated. That is to say, a thickness of the printed patterned conductive layer 1104 is larger when the printed patterned conductive layer 1104 are wider in line width, and the thickness of the printed patterned conductive layer 1104 is thinner when the printed patterned conductive layer 1104 are narrower.

As aforementioned, the patterned conductive layer 1104 may have a rough surface, when the organic light emitting layer 120 is formed on the patterned conductive layer 1104 directly and contacts the patterned conductive layer 1104, the light emitted from the organic light emitting layer 120 disposed on the patterned conductive layer 1104 may be not uniformly distributed or it may crack the patterned conductive layer because the surface roughness of the patterned conductive layer 1104. This may cause the first electrode layer 110 contacts the second electrode layer 130 via the crack place of the patterned conductive layer 1104 and result in a short circuit between the first electrode layer 110 and the second electrode layer 130. In the embodiment, the second transparent conductive layer 1106 covers the patterned conductive layer 1104 and separates the patterned conductive layer 1104 and the organic light emitting layer 120. As shown in FIG. 5A, which illustrates an enlarged view of portion R of the first electrode layer 110 in FIG. 3, the surface roughness of an outer surface S1106 opposite to the substrate 102 of the second transparent conductive layer 1106 is smaller than that of another outer surface S1104 opposite to the substrate 102 of the patterned conductive layer 1104, and the thickness d1 of the second transparent conductive layer 1106 is greater than the roughness of the patterned conductive layer 1104. Therefore, the second transparent conductive layer 1106 is fabricated to cover the patterned conductive layer 1104 in the present embodiment, such that the roughness of the outer surface S1106 may be smoothed, and a short circuit between the first electrode layer 110 and the second electrode layer 130 may be avoided, wherein the outer surface S1106 is a surface of the first electrode layer 110 and is used to contact the organic light emitting layer 120.

In the present embodiment, a cross section of each of the linear patterns of the patterned conductive layer 1104 (take the linear pattern L1 in FIG. 5A as an example) in the thickness direction D1 of the substrate 102 includes a top portion P1 and two lateral portions P2 and P3. In the printed patterned conductive layer 1104, the two lateral portions P2, P3 connect respectively to two opposite sides of the top portion P1 at two arc angles C1 and C2. In other words, a junction between the top portion P1 and the lateral portion P2 of the linear pattern L1 is a lead angle, and a junction between the top portion P1 and the lateral portion P3 of the linear pattern L1 is another lead angle. The top portion P1 and the lateral portion P2 of the linear pattern L1 are connected at the arc angles C1, the top portion P1 and the lateral portion P3 of the linear pattern L1 are connected at the arc angles C2. In other embodiment, the two lateral portions P2, P3 may also connect respectively to the two opposite sides of the top portion P1 through two closed angles, but not limits thereto. The angle between lateral portions P2 (or lateral portion P3) of the linear pattern L1 and the first transparent conductive layer 1102 is acute angle.

On the contrary, in a cross section (not shown) of the patterned conductive layer formed by a photolithography process, an included angle between a lateral surface and a bottom surface is a right angle or an acute angle, which is different from the aforesaid features.

In the present embodiment, it may be seen that the impedance of the first electrode layer 110 may be decreased (by the disposition of the patterned conductive layer 1104) and a short circuit between the first electrode layer 110 and the second electrode layer 130 may be avoided (by the disposition of second transparent conductive layer 1106) with the design of the composite layer structures of the first electrode layer 110. All of the first transparent conductive layer 1102, the patterned conductive layer 1104 and the second transparent conductive layer 1106 have good conductivities, and the second transparent conductive layer 1106 contacts the first transparent conductive layer 1102, therefore, the whole area of the second transparent conductive layer 1106 may have a voltage substantially same as the voltage applied to the first transparent conductive layer 1102, which renders the organic light emitting layer 120 to be driven uniformly at anywhere in the organic light emitting layer 120 by the first electrode layer 110 and to emit light uniformly. Accordingly, the light emitting efficiency of the light emitting device 1/1' or the light emitting unit 100 having the first electrode layer 110 is high and uniform.

In an embodiment, a manufacturing method of an electrode structure is also provided for forming the electrode structure (for example, the first electrode layer 110) on a substrate 102. The manufacturing method includes the following. A first transparent conductive layer 1102 is formed on the substrate 102. A patterned conductive layer 1104 is formed by applying a printing process on the first transparent conductive layer 1102. The step for forming the patterned conductive layer 1104 on the first transparent conductive layer 1102 includes forming a plurality of linear patterns (Take L1, L2 and L3 as an example) on the first transparent conductive layer 1102. The plurality of linear patterns L1, L2 and L3 define one or more openings O. The patterned conductive layer 1104 is formed by applying a printing process, so the cross section of each of the linear patterns L1, L2 and L3 in the thickness direction D1 of the substrate 102 includes a top portion P1 and two lateral portions P2 and P3. In the printed patterned conductive layer 1104, the two lateral portions P2, P3 connect respectively to the two opposite sides of the top portion P1 at two arc angles C1 and C2 or two closed angles.

After forming the patterned conductive layer 1104 on the first transparent conductive layer 1102, a second transparent conductive layer 1106 is formed on the patterned conductive layer 1104 and the first transparent conductive layer 1102. The patterned conductive layer 1104 is disposed between the first transparent conductive layer 1102 and the second transparent conductive layer 1106 in the thickness direction D1 of the substrate 102. The second transparent conductive layer 1106 contacts the first transparent conductive layer 1102 via the one or more openings O defined by the linear patterns L1, L2 and L3 of the patterned conductive layer 1104. The structures and the materials of the substrate 102, the first transparent conductive layer 1102, the patterned conductive layer 1104 and the second transparent conductive layer 1106 have been described above and not repeated here. Therefore the above mentioned electrode structure (as the first electrode layer 110) may be formed on the substrate 102 and then the light emitting unit 100 and the light emitting device 1 (shown in FIG. 1) is formed thereof.

Figure 6:
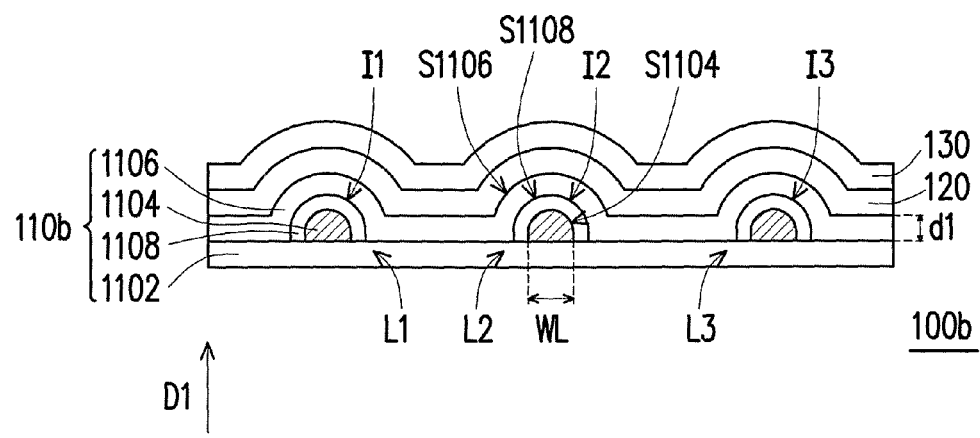
FIG. 6 illustrates a light emitting unit according to another embodiment of the disclosure.
Figure 7:
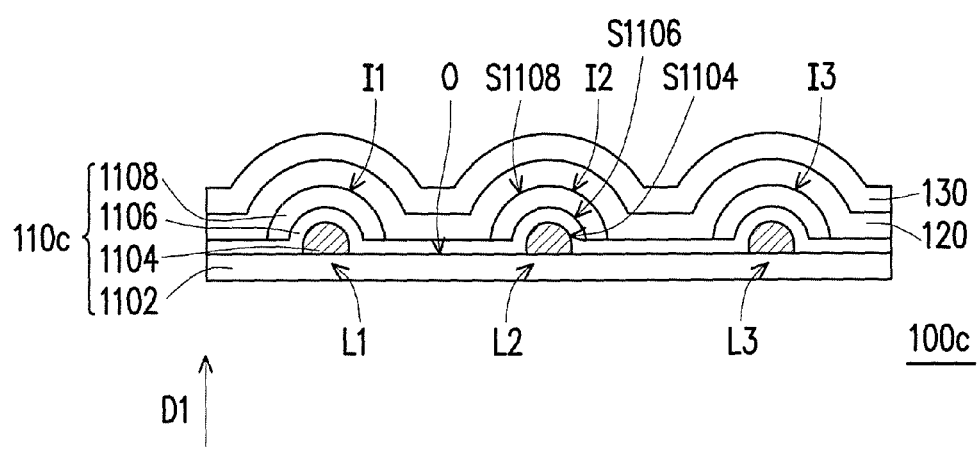
FIG. 7 illustrates a light emitting unit according to another embodiment of the disclosure.

FIG. 6 and FIG. 7 schematically illustrate other embodiments of the light emitting units. Please refer to FIG. 6. In the embodiment of FIG. 6, the light emitting unit 100b is similar to the light emitting unit 100 shown in FIG. 3. The difference between the two is that the first electrode layer 110b of the light emitting unit 100b in the embodiment of FIG. 6 further includes an insulator layer 1108. The insulator layer 1108 is disposed on the patterned conductive layer 1104 and corresponds to the patterned conductive layer 1104. Also, the insulator layer 1108 covers the corresponded patterned conductive layer 1104 such that the insulator layer 1108 is interposed between the patterned conductive layer 1104 and the second transparent conductive layer 1106. In other words, the first transparent conductive layer 1102, the patterned conductive layer 1104, the insulator layer 1108 and the second transparent conductive layer 1106 are formed sequentially on the substrate 102 in the thickness direction D1 of the substrate 102. The patterned conductive layer 1104 is interposed between the first transparent conductive layer 1102 and the insulator layer 1108 in the thickness direction D1 of the substrate 102, such that the patterned conductive layer 1104 is encapsulated by the first transparent conductive layer 1102 and the insulator layer 1108. Therefore the patterned conductive layer 1104 and the insulator layer 1108 are interposed between the first transparent conductive layer 1102 and the second transparent conductive layer 1106 in the thickness direction D1 of the substrate 102, such that the patterned conductive layer 1104 and the insulator layer 1108 are encapsulated by the first transparent conductive layer 1102 and the second transparent conductive layer 1106.

In the embodiment of FIG. 6, the width of the insulation layer 1108 is greater than that of the patterned conductive layer 1104, such that the covering range of the insulation layer 1108 is greater than that of the patterned conductive layer 1104 to encapsulate the patterned conductive layer 1104. Also, the surface roughness of the outer surface S1108 opposite to the substrate 102 of the insulator layer 1108 is smaller than that of the outer surface S1104 opposite to the substrate 102 of the patterned conductive layer 1104, such that a short circuit problem resulting from the surface roughness of the patterned conductive layer 1104 may be avoided. In addition, the thickness d1 of the second transparent conductive layer 1106 is substantially greater than the surface roughness of outer surface S1108 of the insulator layer 1108. Therefore, the roughness of the surface of the first electrode layer 110 (the outer surface S1106) which contacts the organic light emitting layer 120 may be smoothed, and a short circuit between the first electrode layer 110b and the second electrode layer 130 may be avoided.

In the embodiment of FIG. 6, the insulator layer 1108 is made of insulated material (material having no conductivity), thus, the organic light emitting layer 120 fails to emit light at the location corresponding to the disposition of the insulator layer 1108. Therefore, a plurality of insulation patterns I1, I2 and I3 may be fabricated in the insulator layer 1108. These insulation patterns I1, I2 and I3 substantially have a shape and a location similar to those of the linear patterns L1, L2 and L3 of the patterned conductive layer 1104, but the width of the insulation patterns I1, I2 and I3 are greater than that of the linear patterns L1, L2 and L3. The insulation patterns I1, I2 and I3 cover the linear patterns L1, L2 and L3 respectively. Therefore the insulation patterns I1, I2 and I3 contact the first transparent conductive layer 1102 and encapsulate the patterned conductive layer 1104. In addition, a portion of the first transparent conductive layer 1102 the is exposed to the space between every two of the insulation patterns such as I1, I2 and I3 such that the first transparent conductive layer 1102 and the second transparent conductive layer 1106 may contact each other. Accordingly, the region where the insulator layer 1108 is located may still provide the electric transmission function via the second transparent conductive layer 1106 covering on the insulator layer 1108. In other words, the whole area of the first electrode layer 110b may have a good electric transmission effect. Therefore, the light emitting unit 100b having the first electrode layer 110b and the light emitting device 1 (shown in FIG. 1) having the light emitting unit 100b may increase the light emitting area and enhance the light emitting uniformity.

Another embodiment of a manufacturing method of an electrode structure is further provided for forming the electrode structure (for example, the first electrode layer 110b). Unlike the above-mentioned manufacturing method of the first electrode layer 110, the manufacturing method of the first electrode layer 110b in the present embodiment further includes the following. An insulator layer 1108 is formed on the patterned conductive layer 1104 and the insulator layer 1108 corresponds to the patterned conductive layer 1104. The process of forming the insulator layer 1108 on the patterned conductive layer 1104 is after the process of forming the patterned conductive layer 1104 on the first transparent conductive layer 1102 but before the process of forming the second transparent conductive layer 1106 on the patterned conductive layer 1104. Therefore the first transparent conductive layer 1102, the patterned conductive layer 1104, the insulator layer 1108 and the second transparent conductive layer 1106 are formed sequentially on the substrate 102 in the thickness direction D1 of the substrate 102, such that the patterned conductive layer 1104 is interposed between the first transparent conductive layer 1102 and the insulator layer 1108 in the thickness direction D1 of the substrate 102. The structures of the first transparent conductive layer 1102, the patterned conductive layer 1104, the insulator layer 1108 and the second transparent conductive layer 1106 have been described above and not repeated here.

Similarly, please refer to FIG. 7, in this embodiment of FIG. 7, the light emitting unit 100c is similar to the above mentioned light emitting unit 100b (shown in FIG. 6). The difference between the two is that the insulator layer 1108 of the first electrode layer 110c in the present embodiment of FIG. 7 is disposed between the second transparent conductive layer 1106 and the organic light emitting layer 120. In addition, the insulator layer 1108 is also disposed on the second transparent conductive layer 1106 and corresponds to the patterned conductive layer 1104. Therefore the first transparent conductive layer 1102, the patterned conductive layer 1104, the second transparent conductive layer 1106 and the insulator layer 1108 are formed sequentially on the substrate 102 in the thickness direction D1 of the substrate 102. The patterned conductive layer 1104 is interposed between the first transparent conductive layer 1102 and the second transparent conductive layer 1106 in the thickness direction D1 of the substrate 102, and the insulator layer 1108 is interposed between the second transparent conductive layer 1106 and the organic light emitting layer 120 in the thickness direction D1 of the substrate 102 and corresponds to the patterned conductive layer 1104. The patterned conductive layer 1104 is encapsulated by the first transparent conductive layer 1102 and the second transparent conductive layer 1106. The structures of the first transparent conductive layer 1102, the patterned conductive layer 1104, the insulator layer 1108 and the second transparent conductive layer 1106 have been described above and not repeated here.

Accordingly, yet another embodiment of a manufacturing method of an electrode structure is also provided for forming the electrode structure (for example, the first electrode layer 110c). The manufacturing method of the first electrode layer 110c is similar to the above mentioned manufacturing method of the first electrode layer 110b. The difference between the two is that the process of forming the insulator layer 1108 on the patterned conductive layer 1104 in the present embodiment is after the process of forming the second transparent conductive layer 1106 on the patterned conductive layer 1104 and the first transparent conductive layer 1102. Therefore, the first transparent conductive layer 1102, the patterned conductive layer 1104, the second transparent conductive layer 1106 and the insulator layer 1108 are formed sequentially on the substrate 102 in the thickness direction D1 of the substrate 102, such that the patterned conductive layer 1104 is interposed between the first transparent conductive layer 1102 and the second transparent conductive layer 1106 in the thickness direction D1 of the substrate 102, and the insulator layer 1108 is interposed between the second transparent conductive layer 1106 and the organic light emitting layer 120 in the thickness direction D1. The structures of the first transparent conductive layer 1102, the patterned conductive layer 1104, the insulator layer 1108 and the second transparent conductive layer 1106 have been described above and not repeated here.

Figure 8:
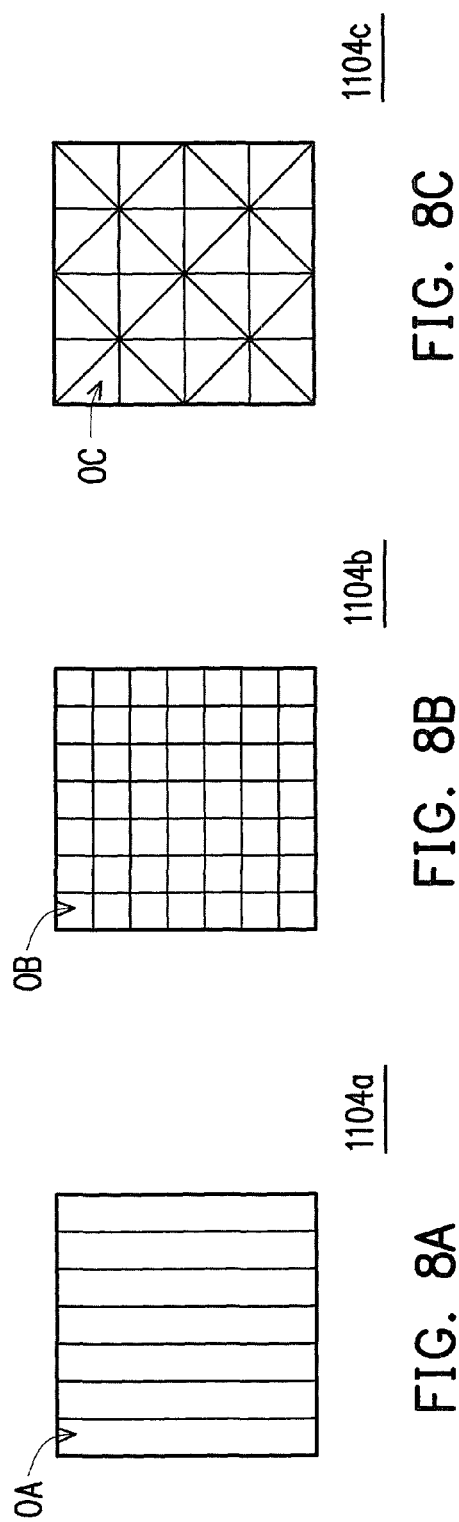
FIG. 8A through FIG. 8E illustrate top views of the patterned conductive layer as shown in FIG. 3.

FIG. 8A through FIG. 8E schematically illustrate top views of the patterned conductive layer shown in FIG. 3. Referring to FIG. 3 and FIG. 8A, in FIG. 8A, the patterned conductive layer 1104a may have a linear pattern L1, L2 and L3 (shown in FIG. 3) defining a plurality of stripe openings OA arranged in parallel. In FIG. 8B, the patterned conductive layer 1104b may have a mesh pattern defining a plurality of rectangle openings OB arranged in an array. In FIG. 8C, the patterned conductive layer 1104c may have another mesh pattern defining a plurality of triangle openings OC arranged in an array. In FIG. 8D, the patterned conductive layer 1104d may have another mesh pattern defining a plurality of diamond openings OD arranged in an array. In FIG. 8E, the patterned conductive layer 1104e may have another mesh pattern defining a plurality of hexagonal openings OE arranged in an array. It may be seen that the pattern design may be, but not limited to the above, also, other patterns in various forms of the patterned conductive layer and various shapes of the openings may be adopted in exemplary embodiments of the disclosure.

According to the light emitting device, the electrode structure and the manufacturing method in the above embodiments, the patterned conductive layer is disposed on the first transparent conductive layer such that the impedance of the electrode structure is decreased, the second transparent conductive layer is disposed on the patterned conductive layer and the first transparent conductive layer to make the patterned conductive layer being interposed between the first transparent conductive layer and the second transparent conductive layer, such that the surface roughness of the electrode structure may be smoothed and a short circuit of the light emitting device may be avoided. Also, the first transparent conductive layer contacts the second transparent conductive layer so the whole area of the first electrode layer may have a good electric transmission effect. Therefore, the light emitting device having the abovementioned first electrode layer may increase the light emitting area and enhance the light emitting efficiency by the conductivity of the second transparent conductive layer. In the embodiments of this disclosure, the light emitting device, the electrode structure and the manufacturing method may decrease the impedance of the electrode structure and the probability of short circuit. In addition, the light emitting device may increase the light emitting area and enhance the light emitting efficiency.

Figure 9:
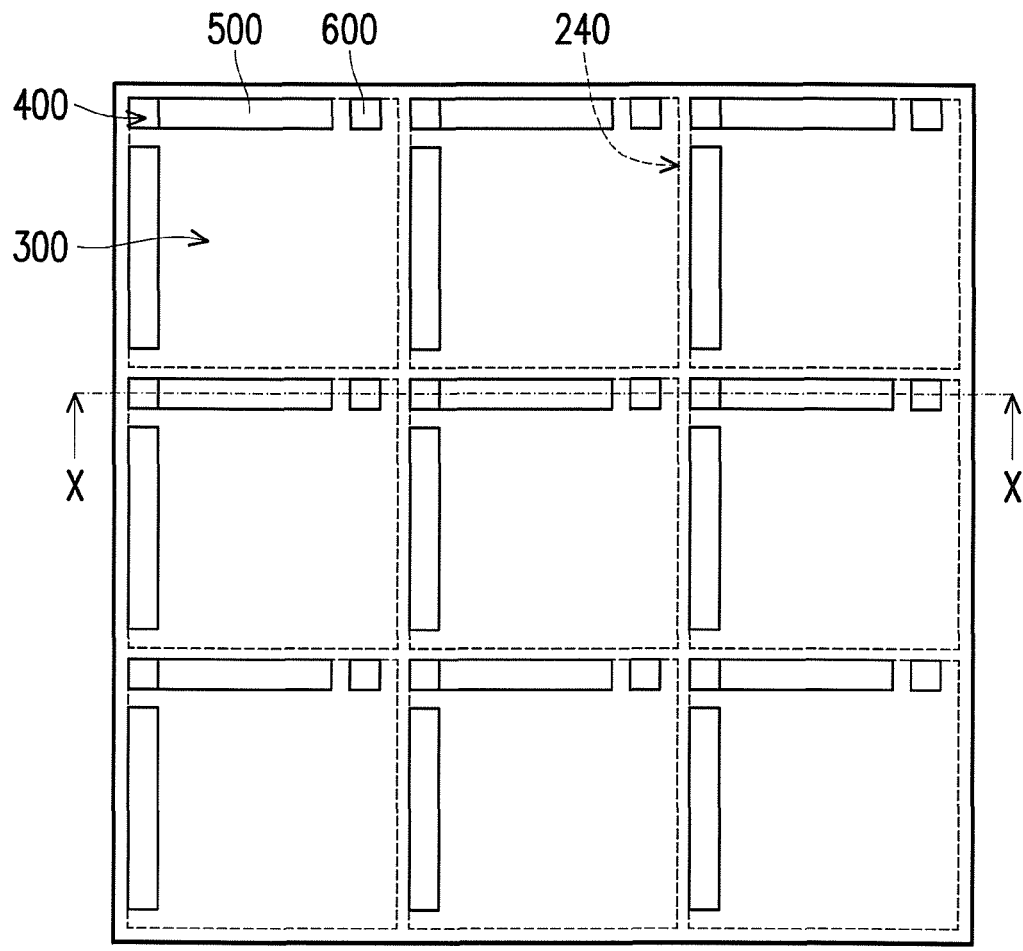
FIG. 9 schematically illustrates a top view of a light emitting device according to another embodiment of the disclosure.
Figure 10:
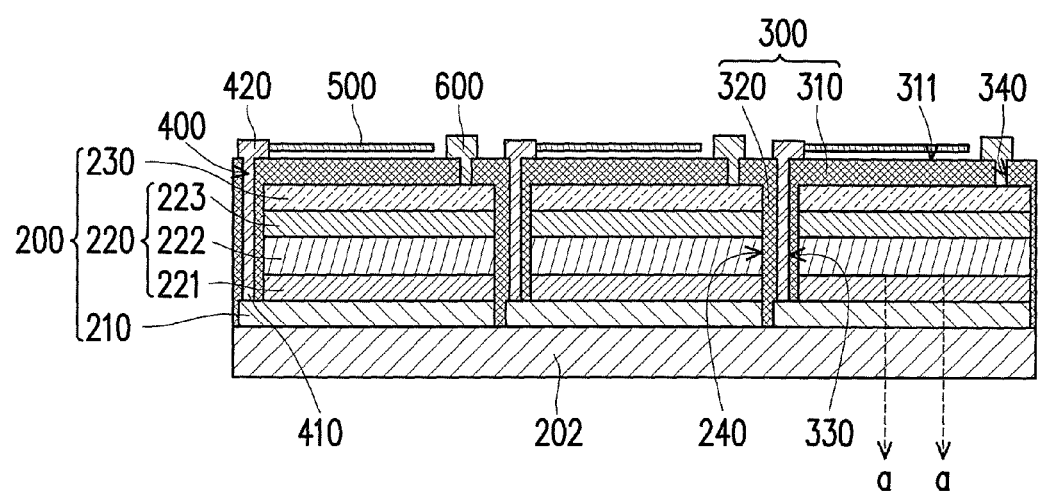
FIG. 10 is a cross-section of the light emitting device of FIG. 9, which is taken along a line X-X.

FIG. 9 schematically illustrates a top view of a light emitting device according to another embodiment. And, FIG. 10 is a cross-section of the light emitting device of FIG. 9, which is taken along a line X-X. In FIG. 9 and FIG. 10, a light emitting device 2 includes a transparent substrate 202, a plurality of light emitting units 200, an insulator layer 300, at least one conductor 400, at least one auxiliary electrode 500, and at least one electrical conductor 600. The transparent substrate 202 may be, but not limited to a glass substrate.

For every two of the plurality of light emitting units 200, there is a gap 240 between the two light emitting units. Each light emitting unit 200 includes a first electrode layer 210, a light emitting layer 220 and a second electrode layer 230.

In the embodiment, the first electrode layer 210 is disposed on the transparent substrate 202. A material of the first electrode layer 210 may be the transparent conductive material such as indium tin oxide (ITO), indium zinc oxide (IZO), aluminum zinc oxide (AZO), zinc oxide (ZnO), or the like.

The light emitting layer 220 is disposed on the first electrode layer 210, and may be, but not limited to an organic light emitting diode. In an alternate embodiment, the light emitting layer 220 may be inorganic light emitting diode, or polymer light-emitting diodes (PLED). The light emitting layer 220 may include a first carrier transmission layer 221, an emission layer 222 and a second carrier transmission layer 223, wherein the first carrier transmission layer 221 and the second carrier transmission layer 223 may have different types of carriers for transmitting there passing through, and the different types of carriers include electron and hole. Herein, the emission layer 222 may emit light due to the use of different-type carriers. The first carrier transmission layer 221 is disposed on the first electrode layer 210 and the light emission layer 222 is disposed on the first carrier transmission layer 221. Taking an organic light emitting diode as an example, the emission layer 222 may be made of the material such as an organic material having a semiconductor property, or the material such as a polymer light emitting diode (PLED), wherein the PLED may be the poly (p-phenylene vinylene), polyacetylene, or derivatives thereof. The second carrier transmission layer 223 is disposed on the emission layer 222 and the second electrode layer 230 is disposed on the second carrier transmission layer 223. The materials of the second electrode layer 230 may be metal materials such as gold, silver, copper, magnesium, or the like.

In the embodiment, the first carrier transmission layer 221 may be a hole transmission layer and the second carrier transmission layer 223 may be an electron transmission layer. In an embodiment, the first carrier transmission layer 221, the emission layer 222 and the second carrier transmission layer 223 may be disposed sequentially on the first electrode layer 210. While, the stacking order of the sequence of these layers is adjustable. In an alternative embodiment, the second carrier transmission layer 223, the emission layer 222 and the first carrier transmission layer 221 may be disposed sequentially on the first electrode layer 210.

In one example, the material of the insulator layer 300 may be polymer having an insulation property, for example, polymers, PDMS, or PVE, or inorganic non-conductive oxides. A material compatible to the OLED fabrication without damaging the elements, providing a protection for the elements, and isolating the water and the oxygen may be adopted for making the insulator layer 300. In addition, the insulator layer 300 may be fabricated as a multilayer structure for achieving a better gas barrier effect. The insulator layer 300 has a covering portion 310 and at least one extending portion 320. The covering portion 310 is disposed on the second electrode layer 230 and the extending portion 320 is disposed inside the gap 240. One side of the extending portion 320 connects the covering portion 310 and the other side thereof contacts the transparent substrate 202. The insulator layer 300 has an external surface 311 and at least one through-hole 330. The external surface 311 is located at a side of the covering portion 310 and away from the second electrode layer 230. The through-hole 330 passes through the covering portion 310 and the extending portion 320 and is further extended from the external surface 311 to the first electrode layer 210.

The conductor 400 is located inside the through-hole 330 of the insulator layer 300. In other words, the insulator layer 300 is located between the conductor 400 and the light emitting layer 220, also, between the conductor 400 and the second electrode layer 230, and this may ensure that there is an electric insulation between the conductor 400 and the second electrode layer 230. In addition, most of the conductor 400 is surrounded and encapsulated by the insulation layer 300, therefore, most part of the conductor 400 is prevented from being oxidized due to contacting the air. The conductor 400 has a first electrode connection terminal 410 and an auxiliary electrode connection terminal 420. The first electrode connection terminal 410 is connected to the first electrode layer 210. The auxiliary electrode connection terminal 420 is protruding from the external surface 311 of the insulator layer 300, therefore, a maximum distance from the auxiliary electrode connection terminal 420 to the transparent substrate 202 is greater than that from the light emission layer 222 to the transparent substrate 202. The material of the conductor 400 may be, but not limited to gold, silver, copper, iron, calcium, magnesium, aluminium, lithium, metal having a low work function, composite metal material polymer with a high conductivity, or metal oxide with a high conductivity.

The auxiliary electrode 500 is disposed on the covering portion 310 of the insulator layer 300 and electrically connects the auxiliary electrode connection terminal 420 of the corresponded conductor 400. The connection of the auxiliary electrode 500 and the first electrode layer 210 may decrease the impedance of the first electrode layer 210. The material of the auxiliary electrode 500 may be, but not limited to gold, silver, copper, iron, aluminium, composite metal material polymer with a high conductivity, or metal oxide with a high conductivity.

A hole 340 is formed above the covering portion 310 of the insulator layer 300 on each light emitting unit 200, and the hole 340 passes through the covering portion 310 of the insulator layer 300. The electrical conductor 600 is formed inside these holes 340 of the plurality of light emitting units 200, in which a terminal of the electrical conductor 600 is connected to the second electrode layer 230 and the other terminal thereof is exposed on the external surface 311 of the covering portion 310 of the insulator layer 300. The exposed portion of the electrical conductor 600 and the first electrode layer 210 are served for connecting a power source to excite the light emitting layer 220 to emit light. At least a part of the light emitted from the light emitting layer 220 may be emitted outward from the transparent substrate 202, for example, the emitted light travels along the direction of an arrow a.

In general, the impedance of the first electrode layer 210 in the organic light emitting diode increases with a longer length of the first electrode layer 210. The increase of the impedance in the first electrode layer 210 leads the uneven distribution of the current, which may reduce the light emitting efficiency of the OLED and shorten the service life of the OLED. In an embodiment, the first electrode layer 210 in FIG. 9 may be replaced by the aforementioned first electrode layer 110 in FIG. 1, but not limits thereto. In addition, the electrical conductor 400 and the auxiliary electrode 500 in the present embodiment may be used for eliminating the aforementioned impedance problem in the first electrode layer 210. The conductor 400 is used for connecting the first electrode layer 210 and the auxiliary electrode 500. The conductor 400 is extended from the first electrode layer 210 to the rear of the light emitting layer 220 (one side of the light emitting layer 220, which is away from the transparent substrate 202), therefore, the auxiliary electrode 500 may be placed at the rear of the light emitting layer 220. As such, the thickness of the auxiliary electrode 500 is not limited by that of the light emitting layer 220, also, the impedance of the first electrode layer 210 may be reduced efficiently. In addition, when the auxiliary electrode 500 is located at the rear of the light emitting layer 220, the auxiliary electrode 500 is located outside the path of light irradiation. Since the auxiliary electrode 500 is no longer a barrier to the emitted light, the light emitting efficiency of the light emitting device 2 is substantially improved.

According to the embodiments of the disclosure, the number of the through-holes 330 may be one or more, the number of the conductors 440 may be one or more, the number of the auxiliary electrodes 500 may be one or more, and the number of the electrical conductor 600 may be one or more.

Figure 11A:
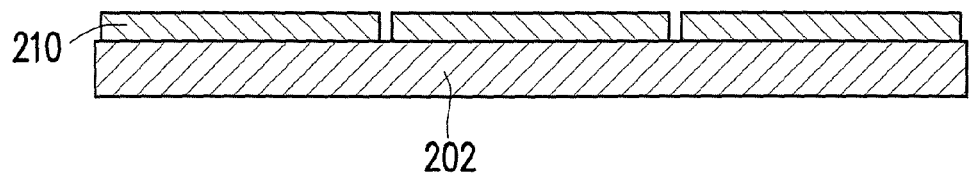
FIG. 11A to FIG. 11H schematically illustrates a fabrication method of the light emitting device depicted in FIG. 10 according to another embodiment of the disclosure.

FIG. 11A through FIG. 11H schematically illustrates a fabrication method of the light emitting device 2 depicted in FIG. 10. In FIG. 11A, a first electrode material layer is formed on the transparent substrate 202 and is patterned into the first electrode layer 210. The first electrode material layer may be formed by sputtering, evaporation, or solvent-solution. The method of patterning the first electrode material layer may be using the mechanical patterning, the laser patterning or the chemical etching.

Figure 11B:
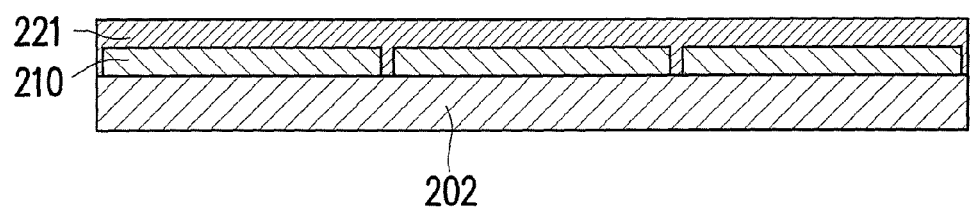
Figure 11C:
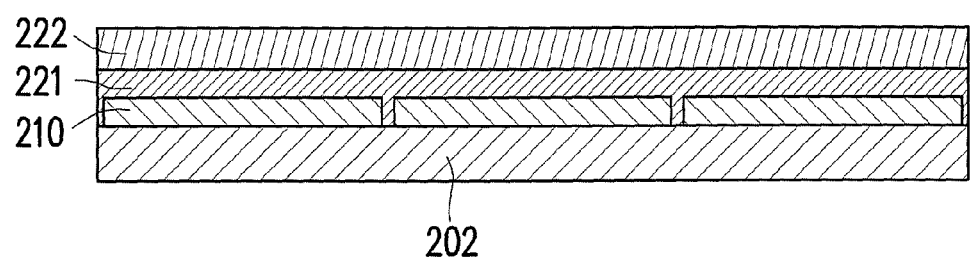
Figure 11D:
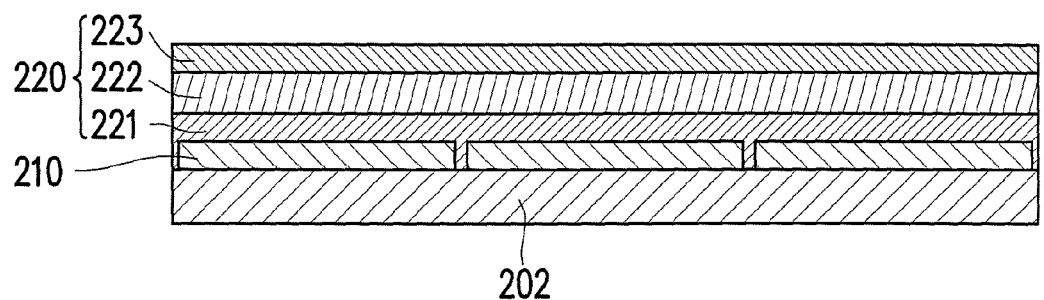
Figure 11E:
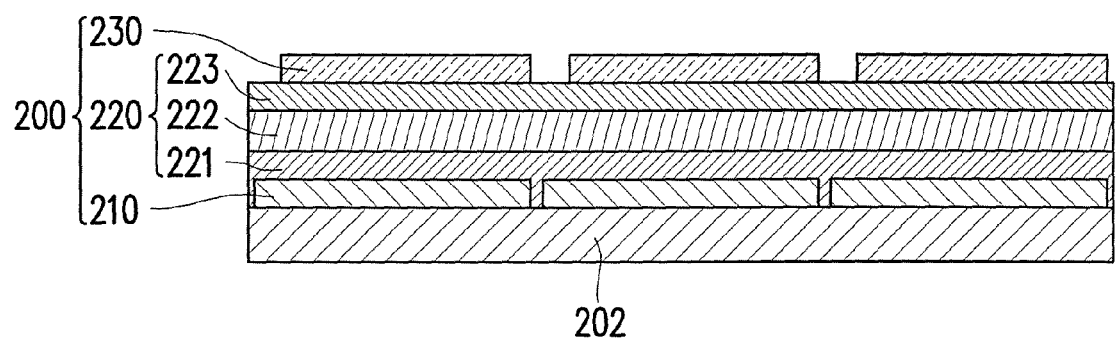

In FIG. 11B, the first carrier transmission layer 221 is formed on the first electrode layer 210. In FIG. 11C, the light emission layer 222 is formed on the first carrier transmission layer 221. In FIG. 11D, the second carrier transmission layer 223 is formed on the light emission layer 222. Herein, the methods of forming the first carrier transmission layer 221, the light emission layer 222 and the second carrier transmission layer 223 includes an evaporation process or a solution applying process. In FIG. 11E, the second electrode layer 230 is formed on the second carrier transmission layer 223 by directly applying an evaporation process or a solution applying process.

Figure 11F:
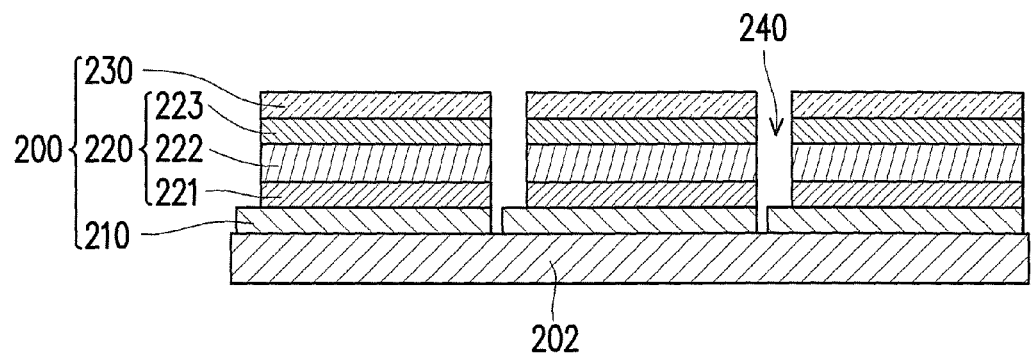

In FIG. 11F, the second carrier transmission layer 223, the light emission layer 222, the first carrier transmission layer 221 and the first electrode layer 210 are patterned to form the plurality of light emitting units 200. The method of patterning the second carrier transmission layer 223, the light emission layer 222, the first carrier transmission layer 221 and the first electrode layer 210 may be, but not limited to a mechanical patterning process, a laser patterning process and a chemical etching process.

Figure 11G:
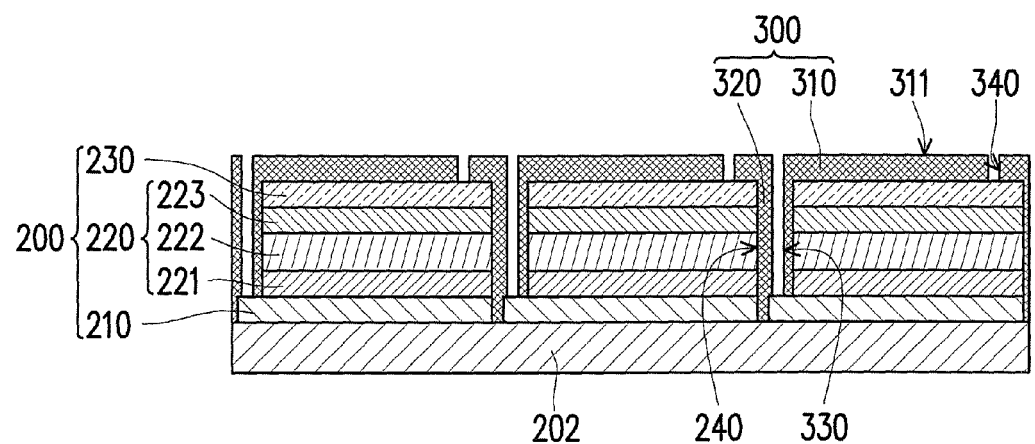

In FIG. 11G, the insulator layer 300 is formed on the second electrode layer 230, and the through-holes 330 and the holes 340 are formed in the insulator layer 300. The method of forming the insulator layer 300 may be, for example, an evaporation process, and the method of forming the through-hole 330 and the holes 340 may be, for example, a mechanical patterning process, a laser patterning process, or a chemical etching process.

Figure 11H:
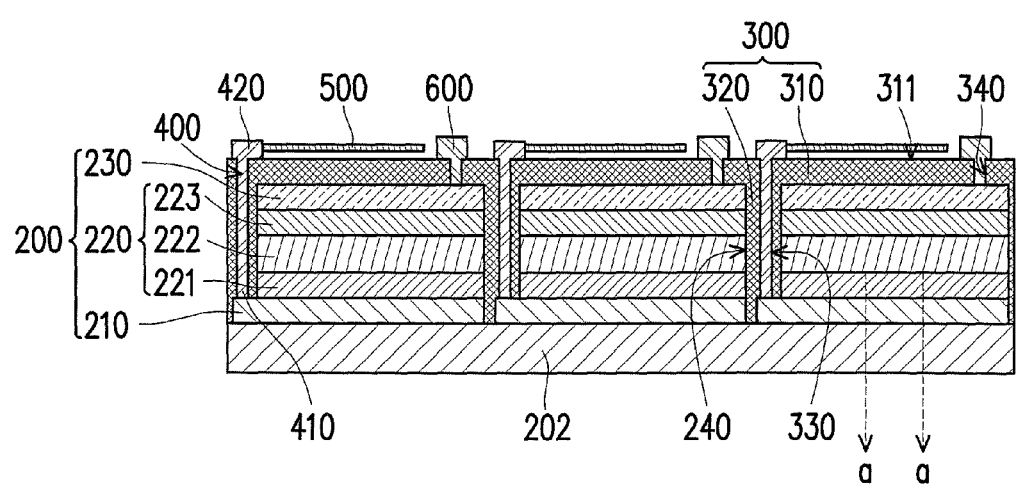

In FIG. 11H, the conductor 400 is formed in the through-holes 330, this makes the first electrode connection terminal 410 contact with the first electrode layer 210 and causes the auxiliary electrode connection terminal 420 protruding from the external surface 311 of the insulator layer 300. The electrical conductor 600 is disposed inside the holes 340 by either penetrating the electrical conductor through the insulator layer 300 or forming the holes prior to filling the electrical conductor into the holes. One terminal of the electrical conductor 600 is connected to the second electrode layer 230 and the other terminal thereof is protruding from the external surface 311 of the covering portion 310 of the insulator layer 300.

It may be shown from FIG. 9 and FIG. 10 that the light emitting device 2 is divided into a plurality of light emitting units 200 separated from one another, but it is not limited thereto.

Figure 12:
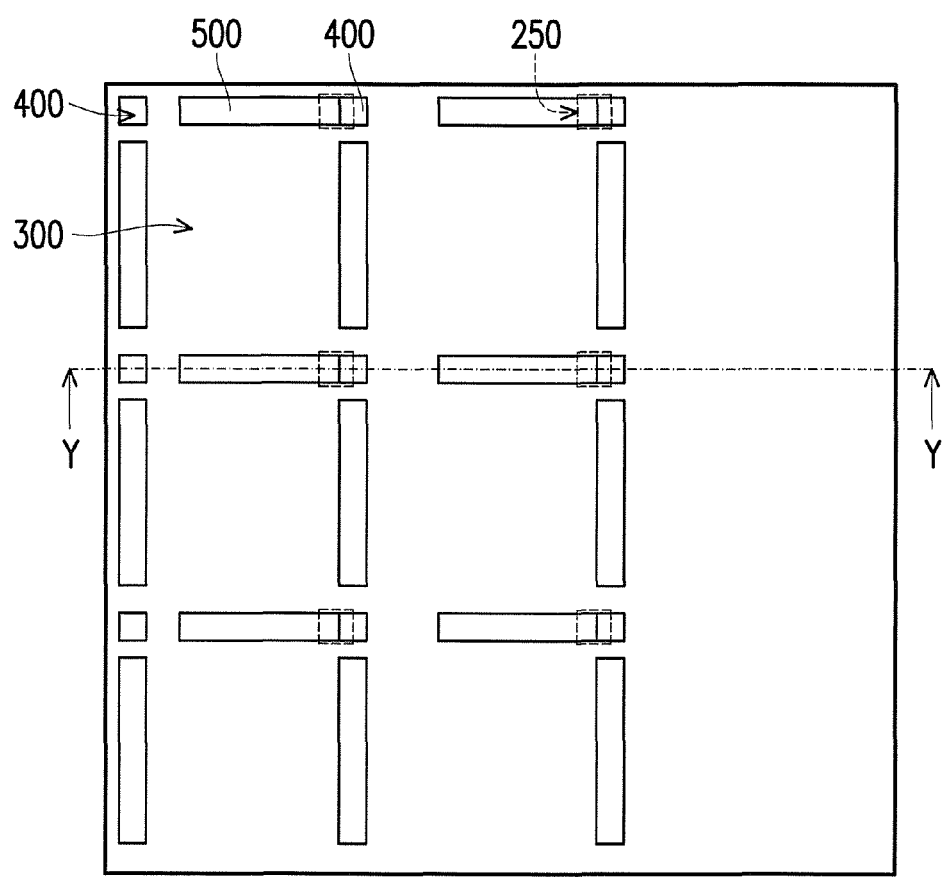
FIG. 12 schematically illustrates a top view of a light emitting device according to another embodiment.
Figure 13:
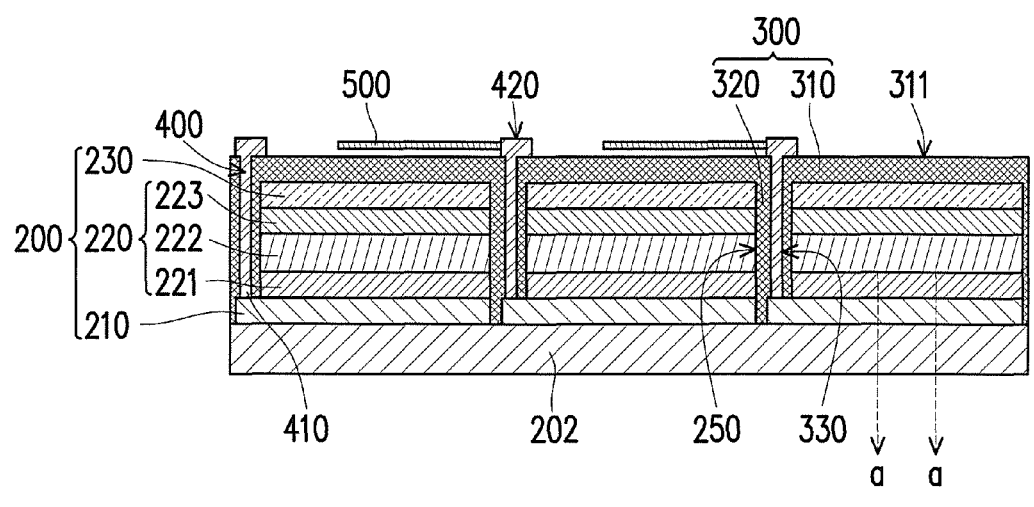
FIG. 13 is a cross-section of the light emitting device of FIG. 12, which is taken along a line Y-Y.

FIG. 12 schematically illustrates a top view of a light emitting device according to another embodiment. And, FIG. 13 is a cross-section of the light emitting device of FIG. 12, which is taken along a line Y-Y. The embodiment of FIG. 12 and FIG. 13 is different from that of FIG. 9 and FIG. 10 in that the light emitting device 2' is not divided into a plurality of light emitting units 200 by the gap 240. Instead, in the embodiment of FIG. 12 and FIG. 13, the light emitting device 2' has a plurality of passing holes 250 as shown in FIG. 12. Each of the passing holes 250 has a shape of a quadrate pillar or a circular cylinder, and passes through the first electrode layer 210, the light emitting layer 220 and the second electrode layer 230. Therefore, the block area connecting the first electrode layer 210, the light emitting layer 220 and the second electrode layer 230 holds a structure of entire block interconnected.

Similar to the previous embodiment, the light emitting device 2' also includes the transparent substrate 202, the first electrode layer 210, the light emitting layer 220, the second electrode layer 230 and the insulator layer 300. The first electrode layer 210 is disposed on the transparent substrate 202, the light emitting layer 220 is disposed on the first electrode layer 210, and the second electrode layer 230 is disposed on the light emitting layer 220. The insulator layer 300 has a covering portion 310 and a plurality of extending portions 320. The covering portion 310 is disposed on the second electrode layer 230. The extending portion 320 is connected to the covering portion 310, located inside the passing hole 250 and contacts the first electrode layer 210. The insulator layer 300 has an external surface 311 and a plurality of through holes 330. The external surface 311 is located at one side of the covering portion 311 away from the second electrode layer 230. The through-holes 330 respectively pass through the covering portion 310 and the extending portions 320, and extend toward the first electrode layer 210 from the external surface 311. The conductors 400 are disposed inside the through-holes 330, and each of the conductors 400 has a first electrode connection terminal 410 and an auxiliary electrode connection terminal 420, wherein the first electrode connection terminal 410 contacts and is electrically connected to the first electrode layer 210, and the auxiliary electrode connection terminal 420 is protruding from the external surface 311. The auxiliary electrode 500 is disposed on the covering portion 310 of the insulator layer 300 and electrically connected to the auxiliary electrode connection terminal 420 of a corresponding conductor 400. Herein, the materials adopted for forming the elements of the light emitting device 2' may refer to those of the light emitting device 2.

The materials of the components of the light emitting device 2' in FIG. 12 and FIG. 13 are the same as those of the components of the light emitting device 2 in FIG. 9 and FIG. 10. It's not repeated here.

According to the above embodiment, the first electrode layer and the auxiliary electrode are connected via the electrical conductor, thus, the auxiliary electrode may be located at the rear of the light emitting unit. Therefore, the auxiliary electrode is not a barrier to the light path of the light emitted by the light emitting units, which increases the light emitting efficiency of the light emitting device. In addition, the thickness of the auxiliary electrode is not limited by that of the light emitting layer, which helps to reduce the impedance of the first electrode layer and prolong the service life of the light emitting device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A light emitting device, comprising:
   a substrate;
   a first electrode layer disposed on the substrate, the first electrode layer further including:
      a first transparent conductive layer, disposed on the substrate;
      a patterned conductive layer, disposed on the first transparent conductive layer; and
      a second transparent conductive layer, disposed on the patterned conductive layer and the first transparent conductive layer, wherein the patterned conductive layer is interposed between the second transparent conductive layer and the first transparent conductive layer in a thickness direction of the substrate;
   an organic light emitting layer, disposed on the substrate; and
   a second electrode layer, disposed on the substrate, and the organic light emitting layer is between the first electrode layer and the second electrode layer in the thickness direction of the substrate.

2. The light emitting device according to claim 1, wherein the second transparent conductive layer contacts the first transparent conductive layer.

3. The light emitting device according to claim 1, wherein the patterned conductive layer further includes a plurality of linear patterns and the plurality of linear patterns define at least one opening, and the second transparent conductive layer contacts the first transparent conductive layer via the at least one opening.

4. The light emitting device according to claim 3, wherein a cross section of each of the plurality of linear patterns in the thickness direction of the substrate includes a top portion and two lateral portions, and the two lateral portions connect respectively to two opposite sides of the top portion at two arc angles or two closed angles.

5. The light emitting device according to claim 1, wherein a thickness of the second transparent conductive layer in the thickness direction of the substrate is less than or equal to that of the first transparent conductive layer in the thickness direction of the substrate.

6. The light emitting device according to claim 1, wherein the patterned conductive layer is covered by the second transparent conductive layer.

7. The light emitting device according to claim 1, wherein a surface roughness of a first outer surface of the second transparent conductive layer is smaller than that of a second outer surface of the patterned conductive layer, and both the first and the second outer surfaces are opposite to the substrate.

8. The light emitting device according to claim 1, wherein the first electrode layer further includes an insulator layer, and the insulator layer is disposed between the patterned conductive layer and the second transparent conductive layer.

9. The light emitting device according to claim 1, wherein the first electrode layer further includes an insulator layer, and the insulator layer is interposed between the second transparent conductive layer and the organic light emitting layer.

10. An electrode structure, adapted to dispose on a substrate, comprising: a first transparent conductive layer, disposed on the substrate; a patterned conductive layer disposed on the first transparent conductive layer, wherein a cross section of patterns of the patterned conductive layer in the thickness direction of the substrate includes a top portion and two lateral portions, and the two lateral portions connect respectively to two opposite sides of the top portion at two arc obtuse angles or two closed obtuse angles; and a second transparent conductive layer, disposed on the patterned conductive layer and the first transparent conductive layer, wherein the patterned conductive layer is interposed between the second transparent conductive layer and the first transparent conductive layer in a thickness direction of the substrate.

11. The electrode structure according to claim 10, wherein the second transparent conductive layer contacts the first transparent conductive layer.

12. The electrode structure according to claim 10, wherein the patterns of the patterned conductive layer further includes a plurality of linear patterns define at least one opening, and the second transparent conductive layer contacts the first transparent conductive layer via the at least one opening.

13. The electrode structure according to claim 10, wherein a thickness of the second transparent conductive layer in the thickness direction of the substrate is less than or equal to that of the first transparent conductive layer in the thickness direction of the substrate.

14. The electrode structure according to claim 10, wherein the patterned conductive layer is covered by the second transparent conductive layer.

15. The electrode structure according to claim 10, wherein a surface roughness of a first outer surface of the second transparent conductive layer is smaller than that of a second outer surface of the patterned conductive layer, and both the first and the second outer surfaces are opposite to the substrate.

16. The electrode structure according to claim 10, further including an insulator layer, wherein the insulator layer is disposed between the patterned conductive layer and the second transparent conductive layer.

17. The electrode structure according to claim 10, further including an insulator layer, wherein the insulator layer is interposed between the second transparent conductive layer and an organic light emitting layer.

18. A manufacturing method of an electrode structure, comprising: forming a first transparent conductive layer on a substrate; forming a patterned conductive layer on the first transparent conductive layer, wherein the patterned conductive layer is formed by applying a printing process, wherein a cross section of patterns of the patterned conductive layer in the thickness direction of the substrate includes a top portion and two lateral portions, and the two lateral portions connect respectively to two opposite sides of the top portion at two arc obtuse angles or two closed obtuse angles; and forming a second transparent conductive layer on the patterned conductive layer and the first transparent conductive layer, wherein the patterned conductive layer is interposed between the second transparent conductive layer and the first transparent conductive layer in a thickness direction of the substrate.

19. The manufacturing method according to claim 18, wherein the step of forming the patterns of the patterned conductive layer on the first transparent forming a plurality of linear patterns on the first transparent conductive layer, wherein the plurality of linear patterns define at least one opening and the second transparent conductive layer contacts the first transparent conductive layer via the at least one opening.

20. The manufacturing method according to claim 18, further including forming an insulator layer on the patterned conductive layer, wherein the step of forming the insulator layer on the patterned conductive layer is before the step of forming the second transparent conductive layer on the patterned conductive layer and the first transparent conductive layer.

21. The manufacturing method according to claim 18, further including forming an insulator layer on the patterned conductive layer, wherein the step of forming the insulator layer on the patterned conductive layer is after the step of forming the second transparent conductive layer on the patterned conductive layer and the first transparent conductive layer.

* * * * *